United States Patent [19]
McAdams et al.

[11] Patent Number: 5,131,018
[45] Date of Patent: Jul. 14, 1992

[54] COUNTER CIRCUIT WITH TWO TRI-STATE LATCHES

[75] Inventors: Hugh P. McAdams, Houston; Paolo Tabacco, Dallas, both of Tex.

[73] Assignee: Texas Instruments Incorporated, Dallas, Tex.

[21] Appl. No.: 560,983

[22] Filed: Jul. 31, 1990

[51] Int. Cl.[5] .......................................... H03K 23/44
[52] U.S. Cl. .................................. 377/117; 377/121; 365/236
[58] Field of Search ............... 377/121, 118, 117, 116, 377/115; 365/236

[56] References Cited

U.S. PATENT DOCUMENTS

| | | | |
|---|---|---|---|
| 4,002,926 | 1/1977 | Moyer | 377/121 |
| 4,068,137 | 1/1978 | Vittoz | 377/121 |
| 4,114,049 | 9/1978 | Suzuki | 377/121 |
| 4,568,842 | 2/1986 | Koike | 377/117 |

*Primary Examiner*—John S. Heyman
*Attorney, Agent, or Firm*—Robby T. Holland; René E. Grossman; Richard L. Donaldson

[57] ABSTRACT

A counter circuit is disclosed. The circuit has a first tri-state inverter for receiving data bits and their components. It includes a first tri-state latch for receiving the data bits and their complements, connected to the output of the first tri-state inverter. It has a second tri-state inverter for receiving the data bits and their complements that is connected to the output of the first tri-state latch. It includes a second tri-state latch for receiving the data bits and their complements. The second tri-state latch is connected to the output of the second tri-state inverter. Its output is the output of the circuit, and, its output is fedback to the first tri-state inverter. Such a circuit is useful in setting an internal address of a dynamic memory device during a CBR cycle.

8 Claims, 3 Drawing Sheets

COUNTER CIRCUIT WITH TWO TRI-STATE LATCHES

CROSS-REFERENCE TO RELATED APPLICATIONS

This application cross-references and incorporates by reference the following simultaneously filed, co-pending and co-assigned applications of Texas Instruments Incorporated:

| Ser. No. | TI-Docket | Title |
| --- | --- | --- |
| 07/560,961 | TI-15379 | A Configuration Selection Circuit for a Semi-conductor Device |
| 07/560,962 | TI-15380 | A Pulse Generation Circuit |
| 07/560,541 | TI-15381 | A CMOS Single Input Buffer for Multiplexed Inputs |
| 07/560,982 | TI-15382 | A Test Validation Method for a Semi-Conductor Memory Device |
| 07/560,523 | TI-15383 | A Voltage Reference Initialization Circuit |
| 07/560,934 | TI-15384 | A Power up Detection Circuit |
| 07/561,536 | TI-15012 | A Power Up Reset Circuit |
| 07/560,662 | TI-15385 | A Substrate Bias Generator System |
| 07/560,542 | TI-15386 | A Voltage Level Detection Circuit |
| 07/560,720 | TI-14642 | A Circuit and Method for Two Stage Redundancy Decoding |
| 07/560,935 | TI-15389 | A Method for Initializing Redundant Circuitry |
| 07/560,646 | TI-14756 | A Voltage Driver Circuit |

FIELD OF THE INVENTION

This invention is in the field of integrated circuits, and is more specifically related to memory devices.

BACKGROUND OF THE INVENTION

The development of VLSI semi-conductor devices of the Dynamic Random Access Memory (DRAM) type is well known. Over the years, the industry has steadily progressed from DRAMS of the 16K type (as shown in the U.S. Pat. No. 4,081,701 issued to White, McAdams and Redwine), to DRAMS of the 64K type (as shown in U.S. Pat. No. 4,055,444 issued to Rao) to DRAMS of the 1 MB type (as shown in U.S. Pat. No. 4,658,377 issued McElroy), and progressed to DRAMS of the 4 MB type. The 16 MB DRAM, wherein more than 16 million memory cells are contained on a single semiconductor chip is the next generation of DRAMs scheduled for production.

In designing VLSI semiconductor memory devices of the 16 MB DRAM type, designers are faced with numerous challenges. One area of concern is power consumption. The device must be able to power the increased memory cells and the supporting circuits. However, for commercial viability, the device must not use excessive power. The power supplies used and the burn in voltage for the part must also be compatible with the thin gate oxides in the device.

Another area of concern is the elimination of defects. The development of larger DRAMS has been fostered by the reduction in memory cell geometries, as illustrated in U.S. Pat. No. 4,240,092 to KUO (a planar capacitor cell) and as illustrated in U.S. Pat. No. 4,721,987 to Baglee et. al. (a trench capacitor cell). The extremely small geometries of the 16 MB DRAM will be manufactured using sub-micron technology. The reduction in feature size has meant that particles that previously did not cause problems in the fabrication process, now can cause circuit defects and device failures.

In order to ameliorate defects, redundancy schemes have been introduced. The redundancy schemes normally consist of a few extra rows and columns of memory cells that are placed within the memory array to replace defective rows and columns of memory cells. Designers need new and improved redundancy schemes in order to effectively and efficiently repair defects and thereby increase yields of 16 MB DRAM chips.

Another area of concern is testing. The device must have circuits to allow for the industry standards 16X parallel tests. In addition, other circuits and test schemes are needed for internal production use to verify operability and reliability.

The options that the device should have is another cause for concern. For instance, some customers require a X1 device, while others require a X4 device. Some require an enhanced page mode of operation. Additionally, it is yet undecided whether the DRAM industry will maintain 4096-cycle refresh, or move towards a lower number of refresh cycles.

Another cause for concern is the physical layout of the chip. The memory cells and supporting circuits must fit on a semiconductor chip of reasonable size. The size of the packaged device must be acceptable to buyers.

New design strategies and circuits are required to meet the above concerns, and other concerns, relating to the development of the next generation, and to future generations, of Dynamic Random Access Memory devices.

It is an object of this invention therefore, to provide an efficient divide by two circuit. This circuit may be used to build counting circuits of arbitrary range by connecting them in serial fashion. Such counting circuits are useful in the generation of an internal address in a CBR cycle of a dynamic memory.

Other objects and advantages of this invention will become apparent to those of ordinary skill in the art, having reference to the following specification, together with the drawings.

SUMMARY OF THE INVENTION

A counter circuit is disclosed. The circuit has a first tri-state inverter for receiving data bits and their complements. It includes a first tri-state latch for receiving the data bits and their complements, connected to the output of the first tri-state inverter. It has a second tri-state inverter for receiving the data bits and their complements that is connected to the output of the first tri-state latch. It includes a second tri-state latch for receiving the data bits and their complements. The second tri-state latch is connected to the output of the second tri-state inverter. Its output is the output of the circuit, and, its output is fedback to the first tri-state inverter. Such a circuit is useful in setting an internal address of a dynamic memory device during a CBR cycle.

DETAILED DESCRIPTION OF THE PREFERRED EMBODIMENT

Figure 1:
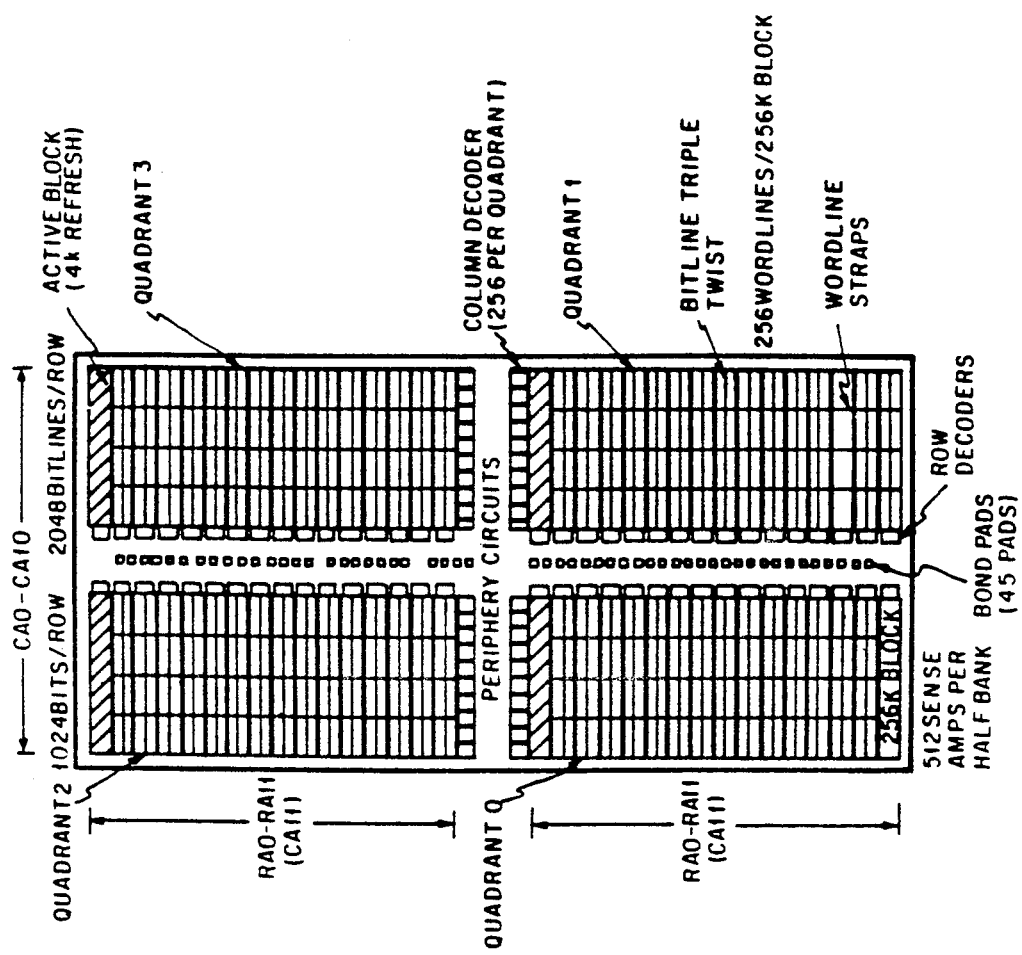
FIG. 1 is a block system level drawing illustrating a 16 MB Dynamic Random Access Memory chip incorporating the preferred embodiment of the invention.

FIG. 1 illustrates a 16 Megabit Dynamic Random Access Memory Chip referred to as a 16 MB DRAM. The chip size is about 325×660 mm. The chip is partitioned into four memory array quadrants. Each memory array quadrant contains 4 Megabits. A 4 MB memory array quadrant contains 16 memory blocks. Each memory block contains 256 Kilobits. The Column Decoders lie along the vertical axis of the chip adjacent to their respective memory array quadrants. The ROW decoders lie along the horizontal axis of the chip, adjacent to their respective memory array quadrants. The periphery circuits containing such devices as the input and output buffers and the timing and control circuits are centrally located along both horizontal the vertical axis of the chip. The bond pads are centrally located along the horizontal axis of the chip.

General characteristics of the 16 MB DRAM device of FIG. 1 follow. The device receives external VDD of typically 5 volts. On chip internal voltage regulation powers the memory arrays of 3.3 volts and the periphery circuits at 4.0 volts to reduce power consumption and channel hot carrier effects. The substrate is biased at $-2$ volts. The organization is bond programmable X1/X4. The enhanced page mode is the main option, with a metal mask programmable option for a write per bit (data mask) operation. The main option for the refresh scheme is 4096 cycles at 64 ms. However, the DRAM is bond programmable for 2048 cycle refresh.

The DRAM has numerous design-for-test features. Test mode entry 1 is through WCBR with no address key for 16X internal parallel test with mode data compare. Test mode entry 2 is WCBR with over-voltage and address key only thereafter (8 volts on A11), Exit from test mode occurs from any refresh cycle (CBR or RAS only). Test mode entry 1 is the industry standard 16X parallel test. This test is similar to those use on the 1 MB and 4 MB DRAMS, except that 16 bits are compared simultaneously instead of 8 bits. The valid address keys are A0, A1, A2, and A6. Test mode entry 2 contains numerous tests. There is a 32X parallel test with data compare and a 16X parallel test with data compare. Different hexadecimal addresses are keyed for the different parallel tests. A storage cell stress test and a VDD margin test allows connection of the external VDD to internal VARY and VPERI through the P-channel devices. Other tests include a redundancy signature test, a row redundancy roll call test, a column redundancy roll call test, a row transfer test, a word-line leakage detection test, clear concurrent test modes, and a reset to normal mode. The DRAM also contains a test validation method that indicates if it has remained in a test mode.

Although not illustrated in FIG. 1, for clarity, the DRAM contains redundancy features for defect elimination. It has four redundant rows per 256K memory block. All four may be used at one time. There are 3 decoders per redundant row and 11 row addresses per redundant row decoder. It uses fuses for row redundancy with, on-average, 10 fuses blown for a single repair. The row redundancy uses a two stage programmable concept to more efficiently enable repair. There are 12 redundant columns per quadrant and four decoders per redundant column. There are 8 column addresses and 3 row addresses per decoder. The total fuse count for column repair is about, on average, 10 fuses blown for a single repair. Column redundancy also has a two-stage programmable feature to more efficiently enable repair.

Figure 2:
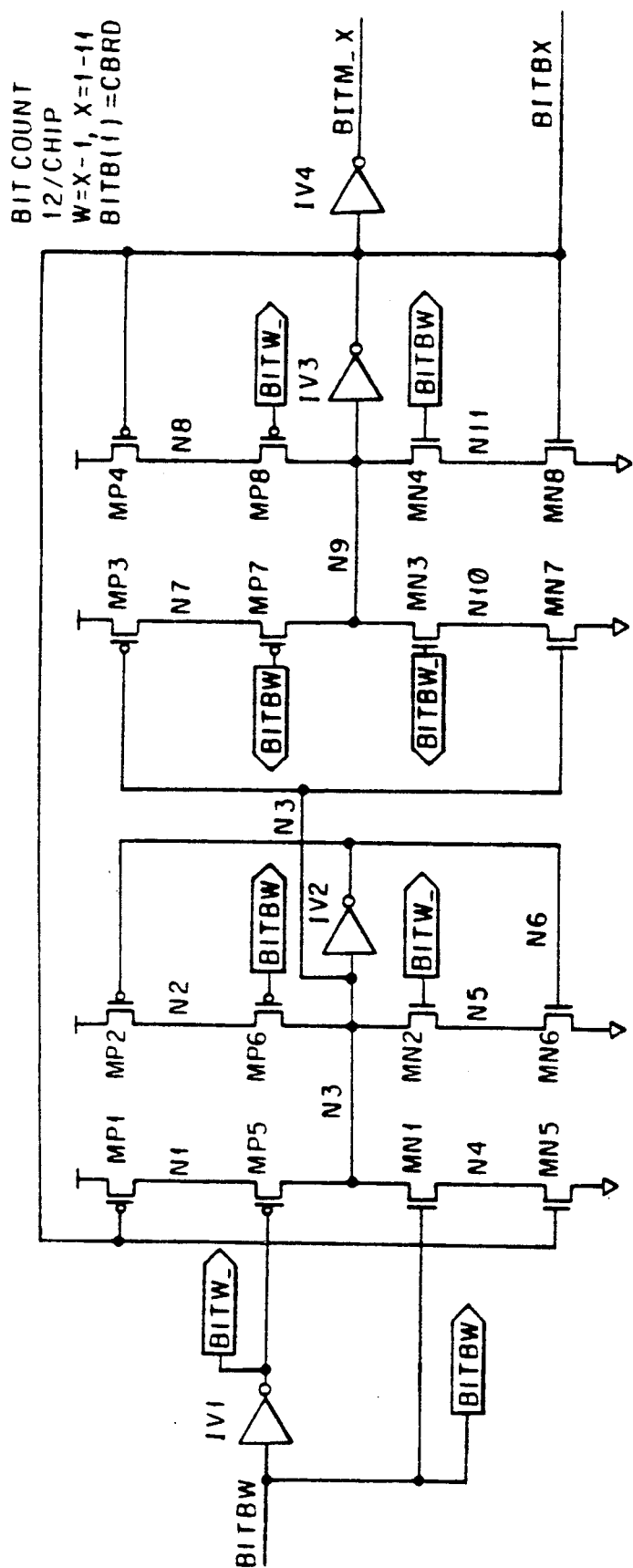
FIG. 2 illustrates the BITCOUNT, or Bit Count Circuit.

FIG. 2 illustrates the BITCOUNT circuit. The BITCOUNT circuit has a single input and two outputs. The input signal, BITBW, is coupled to the following elements; the input of the inverter IV1, the gate terminal of the NMOS device NM1 the gate terminal of the PMOS device MP6, the gate terminal of the PMOS device MP7, and the gate terminal of the NMOS device NM4. The output of the inverter IV1, labeled BITW_, is coupled to the following elements; the gate terminal of the PMOS device MP5, the gate terminal of the NMOS device MN2. The gate terminal of the NMOS device NM3 and the gate terminal of the PMOS device MP8. Node N3 is coupled through the serially connected PMOS devices MP1 and MP5 to the voltage supply VPERI, through the serially connected NMOS devices MN1 and MN5 to a common voltage terminal, through the serially connected PMOS devices MP2 and MP6 to the voltage supply VPERI, through the serially connected NMOS devices MN2 and MN6 to a common voltage terminal, to the input of inverter IV2, to the gate terminal of the PMOS device MP3, and to the gate terminal of the NMOS device MN7. The output of the inverter IV2, labeled N6 is coupled to the gate terminal of the PMOS device MP2, and to the gate terminal of the NMOS device MN6. Node N9 is coupled to the following elements: through the serially connected PMOS devices MP3 and MP7 to the voltage supply VPERI, through the serially connected NMOS devices MN3 and MN7 to a common voltage terminal, through the serially connected PMOS devices MP8 and MP4 to the voltage supply VPERI, through the serially connected NMOS devices MN4 and MN8 to a common voltage terminal, and further connected to the input of the inverter IV3. The output of the inverter IV3 is coupled to the gate terminal of the NMOS device MN8, the gate terminal of the PMOS device MP4, the gate terminal of the NMOS device MN5, the gate terminal of the PMOS device MP1, to the input of the inverter IV4, and to the output signal BITBX. The output of the inverter IV4 is coupled to the output signal BITM_X.

ROW SCHEME OVERVIEW

The 16 megabit array is divided into 4 quadrants, Q0 through Q3 of 4 meg each. Every quadrant has 16 segments of array which consist of 256 physical wordlines each. This comes out to 4096 physical wordlines per quadrant and 16,384 physical wordlines in the whole array. During an access to any physical wordline, 3 wordlines from each of the other three quadrants are active. Thus 4 physical wordlines make a logical wordline.

For decoding, every segment has 64 decoders. Every two adjacent segments, e.g. 0/1 or 2/3 or 4/5, etc., are paired and share the same 4 predecoders. First, 4 pairs, 0/1, 2/3, 4/5 and 6/7, share the same MASTER WORDLINE DRIVER, RLXHLQ, and the next 4 pairs share RLXHRQ.

In any cycle, the combination of block select and row factors select 1 of 1024 decoders, thus selecting 4 row predecoders in each quadrant. The row decoders, upon getting sensing that it is not a redundant row, activates 2 of the predecoders. One of these predecoders uses RLXHLQ and the other uses RLXHRQ. In wordline booting, only 1 of the 2 RLXH signals is booted. Thus, there is only one active predecoder in every quadrant and in every quadrant, a physical wordline is selected.

In DFT mode additional parallel rows are activated by disabling various stages of decoding. When the MASTER WORDLINE DRIVER select is disabled, every quadrant is divided into 2 octants of 8 segments of array 0 through 7 and 8 through 15 therefore allowing 2 rows to be accessed at every instant. This is done in DFT modes X32 PARALLEL TEST, ROW COPY, WORD LINE STRESS, and the 2K REFRESH mode.

In the DFT WORD LINE STRESS, besides the above, the address RA0 is disabled in the predecoders. By doing so, 2 physical wordlines are active per octant, for a total of 4 wordlines accessed in a quadrant.

ROW CLOCKS

The row clock chain of clock signals are activated when RAS_ goes low. This is the start of any active cycle to the device. The chain of activities includes latching of row addresses, decoding of row addresses, deciding if it is a refresh cycle and activating the column decoders.

In normal operation, either the output RBC for RAS BEFORE CAS cycle, or CBR, for CAS BEFORE RAS cycle is asserted high. A similar signal, but with delayed falling edge from CBR is generated. This is the CBRD signal. CBRD is used as incremental clock signal for CAS BEFORE RAS internal counter. The falling edge of this signal does the incrementation. Thus, by delaying the internal counter, it provides the device enough time to switch off its ROW ADDRESS BUFFER before changing the internal counter address.

Figure 3:
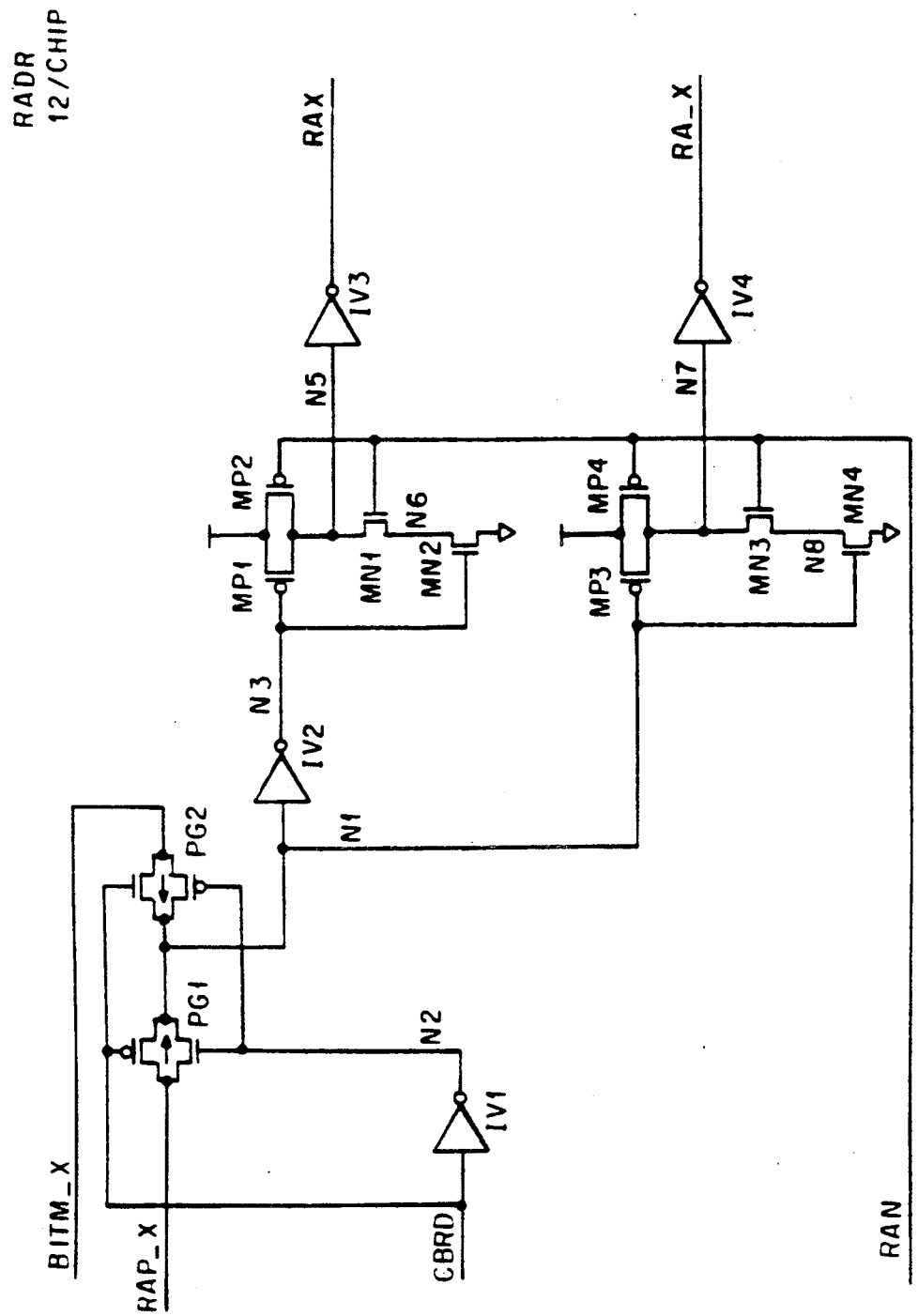
FIG. 3 illustrates the RADR, or Row Address Driver Circuit.

RADR—ROW ADDRESS DRIVER—schematic FIG. 3

This is driver for the row address. Control signal, RAN starts the driving of the address signal. Besides being just a driver, it multiplexes the external latched row address and the CBR internal counter address before the driving.

BITCOUNT—CBR INTERNAL ADDRESS, BITCOUNT—schematic FIG. 2

There are 12 sets of this circuit connected in series in the device. It serves as a 12 bit internal address used during a CBR cycle. The circuit is a flip-flop that activates on the falling edge of its input signal. For the lowest significant set, the input is the CRBD signal and the output is the LSB of the CBR row address and it is also the input to the next set of BITCOUNT circuit. This continues in series until it makes 12 CBR address lines. Such a circuit does an incremental binary county based on the pulse on CBRD.

The disclosed counter circuit has a first tri-state inverter for receiving data bits and their complements. It includes a first tri-state latch for receiving the data bits and their complements, connected to the output of the first tri-state inverter. It has a second tri-state inverter for receiving the data bits and their complements that is connected to the output of the first tri-state latch. It includes a second tri-state latch for receiving the data bits and their complements. The second tri-state latch is connected to the output of the second tri-state inverter. Its output is the output of the circuit, and, its output is fedback to the first tri-state inverter. Such a circuit is useful in setting an internal address of a dynamic memory device during a CBR cycle.

The counter circuit, also referred to as a divide by two circuit, advantageously provides a modular circuit useful for building counter circuits of arbitrary range. The divide by two circuits may be laid out efficiently in a serial fashion, with the outputs of each stage connected to the data inputs of the following stage, no additional routing between stages is required. No clocks, strobes or controls are required, the devices being clocked off the input data bits.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. A counter circuit to count data bits, comprising:
   a first tri-state inverter for receiving the data bits and their complements;
   a first tri-state latch for receiving the data bits and their complements, connected to the output of the first tri-state inverter;
   a second tri-state inverter for receiving the data bits and their complements, connected to the output of the first tri-state inverter; and
   a second tri-state latch for receiving the data bits and their complements, connected to the output of the second tri-state inverter, its output forming the output of the circuit, its output fedback to the first tri-state inverter.

2. The counter circuit of claim 1 wherein:
   the output of the first tri-state latch is fedback to the first tri-state latch;
   the output of the second tri-state latch is fedback to the second tri-state latch.

3. A divide by two circuit, comprising:
   a first tri-state inverter for receiving data bits and the complements, having an enable terminal;
   a first tri-state latch for receiving data bits and their complements, having an enable terminal;
   a second tri-state inverter for receiving data bits and the complements, having an enable terminal;
   a second tri-state latch for receiving data bits and their complements, having an enable terminal;
   the output of the first tri-state inverter connected to the first tri-state latch and connected to the enable terminal of the second tri-state inverter;
   the output of the first tri-state latch connected to the enable terminal of the first tri-state latch; and
   the output of the second tri-state latch connected to the enable terminal of the first tri-state inverter and connected to the enable terminal of the second tri-state latch.

4. The divide by two circuit of claim 3 wherein the first tri-state inverter comprises:
   a first P-channel transistor and a second P-channel transistor connected in series, the first P-channel transistor having one terminal connected to a voltage source;

a first N-channel transistor and a second N-channel transistor connected in series, the second N-channel transistor having one terminal connected to ground;

the second P-channel transistor being connected to the first N-channel transistor;

the gate of the first P-channel transistor and the gate of the second N-channel transistor being connected together to form the enable terminal; and the gate of the second P-channel transistor connected to the complemented data bits, the gate of the first N-channel transistor connected to the data bits.

5. The divide by two circuit of claim 4 wherein the first tri-state latch comprises:
   a first P-channel transistor and a second P-channel transistor connected in series, the first P-channel transistor having one terminal connected to a voltage source;
   a first N-channel transistor and a second N-channel transistor connected in series, the second N-channel transistor having one terminal connected to ground;
   the second P-channel transistor connected to the first N-channel transistor;
   the gate of the second P-channel transistor being connected to the data bits, the gate of the first N-channel transistor being connected to the complemented data bits; and
   an inverter, whose input is connected to second P-channel transistor and to the first N-channel transistor, and whose output is connected to the gates of the first P-channel transistor and the second N-channel transistor.

6. The divide by two circuit of claim 5 wherein the second inverter comprises:
   a first P-channel transistor and a second P-channel transistor connected in series, the first P-channel transistor having one terminal connected to a voltage source;
   a first N-channel transistor and a second N-channel transistor connected in series, the second N-channel transistor having one terminal connected to ground;
   the second P-channel transistor connected to the first N-channel transistor;
   the gate of the second P-channel transistor connected to the data bits, the gate of the first N-channel transistor connected to the complemented data bits; and
   the gates of the first P-channel transistor and the second N-channel transistor being connected together and connected to the input of the inverter of the first tri-state latch.

7. The divide by two circuit of claim 6 wherein the second tri-state latch comprises:
   a first P-channel transistor and a second P-channel transistor connected in series, the first P-channel transistor having one terminal connected to a voltage source;
   a first N-channel transistor and a second N-channel transistor connected in series, the second N-channel transistor having one terminal connected to ground;
   the second P-channel transistor connected to the first N-channel transistor;
   the gate of the second P-channel transistor connected to the complemented data bits, the gate of the first N-channel transistor connected to the data bits;
   an inverter whose input is connected to the second P-channel transistor and to the first N-channel transistor, and whose output is connected to the gates of the first P-channel transistor and the second N-channel transistor, and connected to the gates of the first P-channel transistor and the second N-channel transistor of the first tri-state inverter.

8. An integrated circuit dynamic memory device, comprising:
   an array of memory cells;
   periphery circuitry to read information from the memory cells and write information to the memory cells;
   the periphery circuitry including circuitry to generate RAS, CAS, and CBR timing signals, and including a circuit whose input is coupled to the CBR timing signal and is responsive to perform an incremental binary count to set a CBR internal address during a CBR cycle, the circuit comprising:
   a first tri-state inverter for receiving the CBR timing signals and the complements of the CBR timing signals;
   a first tri-state latch for receiving the CBR timing signals and the complements, connected to the output of the first tri-state inverter;
   a second tri-state inverter for receiving the CBR timing signals and their complements, connected to the output of the first tri-state latch; and
   a second tri-state latch for receiving the CBR timing signals and their complements, connected to the output of the tri-state inverter, its output forming the output of the circuit, its output fedback to the first tri-state inverter;
   the output of the first tri-state latch being fedback to the first tri-state latch; and
   the output of the second tri-state latch is fedback to the second tri-state latch.

* * * * *